United States Patent
Boguslavskij et al.

(10) Patent No.: US 8,000,668 B2
(45) Date of Patent: Aug. 16, 2011

(54) TRANSMIT/RECEIVE CIRCUIT WITH PIN DIODES

(75) Inventors: Mihail Boguslavskij, Coburg (DE); Peter Nikles, Erlangen (DE); Jürgen Reithinger, Neunkirchen am Brand (DE); Ulrich Schätzle, Forchheim (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 697 days.

(21) Appl. No.: 11/823,042

(22) Filed: Jun. 26, 2007

(65) Prior Publication Data

US 2007/0298712 A1    Dec. 27, 2007

(30) Foreign Application Priority Data

Jun. 26, 2006    (DE) .................. 10 2006 029 195

(51) Int. Cl.
*H04B 1/16*    (2006.01)

(52) U.S. Cl. ........ 455/217; 455/41.1; 455/41.2; 455/82; 455/87; 455/180.4; 455/191.2; 455/193.3; 455/197.2; 381/8; 381/9; 381/326; 381/331

(58) Field of Classification Search .................. 381/331, 381/7, 8, 9, 78, 326, 312, 314, 315; 600/422; 438/171; 324/318; 455/217, 41.1, 41.2, 455/41.3, 82, 87, 180.4, 191.2, 193.3, 197.2
See application file for complete search history.

(56) References Cited

U.S. PATENT DOCUMENTS

| | | | | |
|---|---|---|---|---|
| 4,554,512 | A * | 11/1985 | Aiello | 330/10 |
| 4,793,356 | A * | 12/1988 | Misic et al. | 600/422 |
| 5,341,114 | A | 8/1994 | Calviello et al. | |
| 5,445,985 | A * | 8/1995 | Calviello et al. | 438/171 |
| 5,714,900 | A | 2/1998 | Ehlers | |
| 5,903,150 | A * | 5/1999 | Roznitsky | 324/318 |
| 7,366,316 | B2 * | 4/2008 | Reithinger | 381/331 |

FOREIGN PATENT DOCUMENTS

| | | |
|---|---|---|
| DE | 10304479 B3 | 7/2004 |
| EP | 1301017 A1 | 4/2003 |
| GB | 2312105 A | 10/1997 |
| WO | 8701199 A1 | 2/1987 |

* cited by examiner

*Primary Examiner* — Junpeng Chen

(57) ABSTRACT

Structurally simple transmit/receive circuits for hearing devices are to be able to be deployed for higher frequencies as well. It is therefore proposed according to the invention that at least two PIN diodes should be connected in an anti-parallel manner between the receive oscillating circuit and the amplifier connected thereto to protect the amplifier. A capacitance diode can optionally be expanded so that larger component tolerances can be permitted for the circuit.

14 Claims, 1 Drawing Sheet

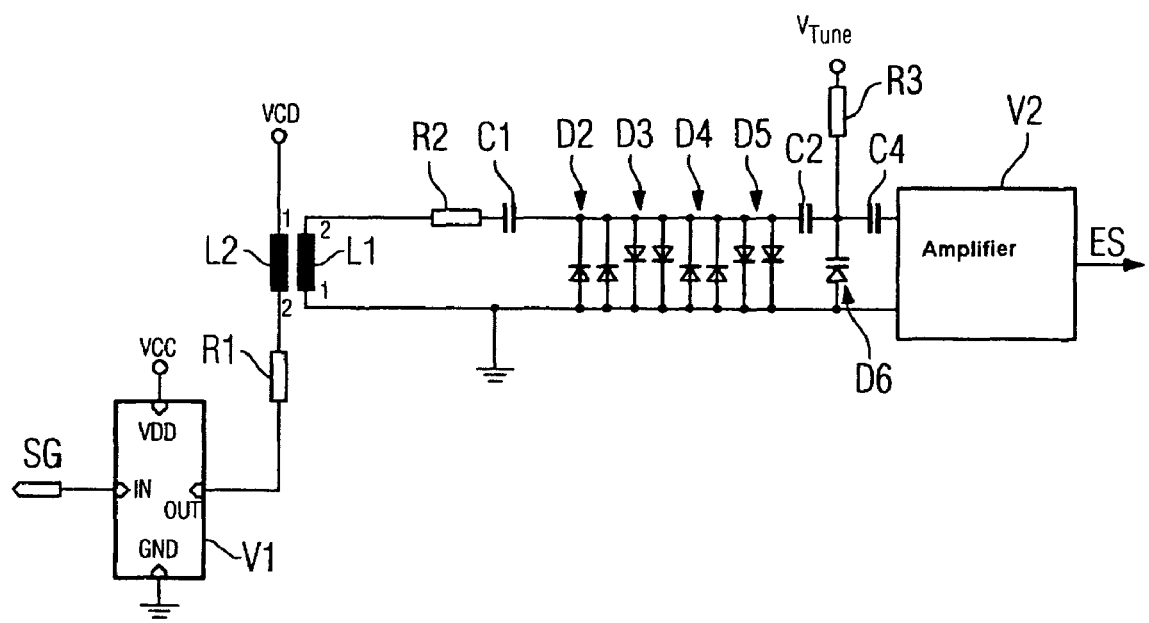

TRANSMIT/RECEIVE CIRCUIT WITH PIN DIODES

CROSS REFERENCE TO RELATED APPLICATIONS

This application claims priority of German application No. 10 2006 029 195.6 filed Jun. 26, 2006, which is incorporated by reference herein in its entirety.

FIELD OF THE INVENTION

The present invention relates to a transmit/receive circuit with a transmit/receive antenna for the inductive transmission of signals, a receive oscillating circuit, which is connected to the transmit/receive antenna, and an amplifier, which is connected to the receive oscillating circuit. In particular the present invention relates to a remote control for a hearing device with such a transmit/receive circuit.

BACKGROUND OF THE INVENTION

The publication DE 103 04 479 B3 is known to be the closest prior art. This describes a device for transmitting and receiving data for remote controls for hearing devices. It shows how a combined transmit/receive unit can be realized with a single transmit/receive antenna, without overloading the downstream receiver. Standard silicon protective diodes are used here, which function well at low frequencies and comparatively high resonant capacitances, their blocking capacitance being negligible. These diodes are necessary in order to limit the voltage at the input of the receive circuit in the transmit instance. They are therefore essential for the combined transmit/receive circuit.

It is necessary also to be able to deal with higher bandwidths with the transmit/receive circuits of hearing devices. However with the known device for the transmission of higher bandwidths described above, as soon as a switch is made to higher frequencies, smaller inductances and also smaller capacitances are deployed. This means that the blocking capacitances of the protective diodes are no longer negligible and they detune the resonant circuit in the receive element significantly. Moreover the blocking capacitances of the diodes are not known and can vary with the manufacturing process. This makes a clean tuning of the oscillating circuit in the receive element very difficult, so it would have to be carried out manually on an individual basis in each device with a high level of outlay. It is not possible to dispense with said diodes however, as they are absolutely essential as input protection elements for the receive amplifier. Without protection very high voltages would occur at the input of the receive amplifier in the transmit instance, leading to destruction of the receive amplifier.

The further publication EP 1 301 017 A1 describes a mobile communication device with electrostatic discharge protection. Two PIN diodes are connected in an anti-parallel manner between the high-frequency input of the receiver and ground. They serve as overvoltage protection and are characterized by their minimal effect on high-frequency signals due to their very low capacitance.

SUMMARY OF THE INVENTION

The object of the present invention is therefore to propose a transmit/receive circuit with a single transmit/receive antenna, which is also suitable for the transmission of higher bandwidths.

According to the invention this object is achieved by a transmit/receive circuit with a transmit/receive antenna, a receive oscillating circuit, which is connected to the transmit/receive antenna, and an amplifier, which is connected to the receive oscillating circuit, with at least two PIN diodes being connected in an anti-parallel manner between the receive oscillating circuit and the amplifier to protect the amplifier. A capacitance diode is connected parallel to the PIN diodes. This allows adequate tuning of the receive oscillating circuit to be achieved, even with larger component tolerances.

The PIN diodes deployed according to the invention advantageously have lower blocking layer capacitances, so the transmit/receive circuit can also be deployed for higher frequencies. If larger currents are anticipated in the receive circuit, further PIN diode pairs connected in an anti-parallel manner can be connected parallel to the one PIN diode pair connected in an anti-parallel manner.

A control voltage to trim the receive oscillating circuit can be applied to the capacitance diode. This control also enables the receive oscillating circuit to be compensated automatically if required.

It is necessary to have a capacitor between the capacitance diode and the PIN diodes, to decouple the DC control voltage at the capacitance diode toward the oscillating circuit.

A transmitter can also be coupled to the transmit/receive antenna, it being possible to operate said transmitter with reduced power compared with its stipulated transmission at the resonant frequency of the receive oscillating circuit, to tune the receive oscillating circuit. Such excitation of the receive oscillating circuit allows said receive oscillating circuit to be better tuned by measuring the amplitude in the receiver.

BRIEF DESCRIPTION OF THE DRAWINGS

The present invention is described below with reference to the accompanying drawing, which shows a circuit diagram of an inventive transmit/receive circuit.

DETAILED DESCRIPTION OF THE INVENTION

The exemplary embodiment described in more detail below represents a preferred embodiment of the present invention.

The transmit/receive circuit for a hearing device shown in the figure has a transmit/receive antenna L1, configured as a coil. A second coil L2, serving to transmit a transmit signal of a transmit amplifier V1 in an inductive manner, is coupled loosely to it. To this end the transmit amplifier V1 is coupled by way of a resistor R1 to the coil L2. The coil L2 is connected to a supply voltage VCC on the other side. The transmit amplifier V1 is also supplied with the supply voltage VCC at its supply voltage pin VDD. It is connected to ground at the pin GND. It receives a transmit signal to be amplified SG by way of its input IN. The transmit amplifier V1 is only active when transmitting and is deactivated in the receive instance.

The receive circuit is connected to the transmit/receive antenna L1. The antenna coil L1 forms a resonant circuit together with a main adjusting capacitor C1 connected by way of a resistor R1, said resonant circuit being excited to oscillate when receiving. The signal of the resonant oscillating circuit is amplified by an amplifier V2, which has little background noise, so a correspondingly amplified receive signal ES results.

Since the receive element (in the figure on the right next to the transmit/receive antenna L1) also oscillates during transmission, with very high field strengths and correspondingly high voltages then occurring, the receive amplifier V2 must be appropriately protected. A PIN diode array consisting of the PIN diode pairs D2, D3, D4 and D5 is therefore connected parallel to the receive oscillating circuit L1, C1 here. The individual diode pairs here each consist of two PIN diodes connected in parallel. The PIN diode pairs D2 and D3 are connected in an anti-parallel manner, as are the PIN diode pairs D4 and D5. In principle a simple PIN diode pair connected in an anti-parallel manner could be deployed instead of the PIN diode array, if the occurring currents are correspondingly small. The number of PIN diodes should be adjusted accordingly in the case of larger currents.

In the receive instance, when the signal is very small and not above the switching threshold of the PIN diodes, the PIN diode array blocks. In contrast in the transmit instance, when the signal is correspondingly large, the PIN diode array forms a short circuit, which protects the amplifier V2.

A varactor diode is connected parallel to the PIN diode array, in other words parallel to the input of the amplifier V2, by way of a capacitor C2. In the receive instance the capacitor C2 together with the capacitance of the varactor diode D6 compensates for the loss of the coil L2.

So that the capacitance of the varactor diode D6 can be adjusted correspondingly, the connecting point between the capacitor C2 and the varactor diode D6 is subjected by way of a resistor R3 to a setting voltage $V_{Tune}$. The connecting point between the capacitor C2 and the varactor diode D6 is connected to the one input terminal of the amplifier V2 by way of a coupling capacitor C4. The other input terminal, which is connected to the anode of the varactor diode, a common contact of the PIN diode array and a terminal of the transmit/receive antenna L1, is connected to ground.

The mode of operation of the inventive transmit/receive circuit is described in more detail below. Since PIN diodes are deployed here instead of standard diodes, detuning of the oscillating circuit in the receive instance is very slight even at higher frequencies, as these PIN diodes have very small blocking capacitances. In addition, to compensate for this relatively small residual error, a further capacitance or varactor diode D6 can be deployed, which can compensate for any residual errors. This varactor diode D6 can either be subjected manually to an appropriate control voltage $V_{Tune}$ or the trimming process is carried out automatically by measuring the oscillating circuit amplitude at resonant frequency and an interactive compensation takes place. This reduces the tuning process to the setting of a single trimming potentiometer or it can even be carried out fully automatically. The capacitance diode should only be deployed in conjunction with the PIN diodes, since the blocking layer capacitance of standard diodes is generally too high and could not be fully compensated for by a capacitance diode.

Automation of the compensation method is advantageous in particular because the circuit as a whole is subject to an aging process and temperature fluctuations. Therefore automatic compensation is available at every switch from transmit to receive or vice versa. Automation can be achieved by activating the transmitter to the resonant frequency with minimal power (e.g. reduced by pre-resistor) and measuring the receive voltage behind the low-noise receive amplifier V2. Frequency tuning is optimal, when the maximum voltage is reached. Alternatively the receive voltage can simply be compared with a reference voltage and the transmit power is varied. At the point when the reference voltage is no longer reached, the transmit power is too low. The power must then be increased a level. The tuning can be changed, when the reference voltage is reached/exceeded during interim tuning.

The inventive transmit/receive circuit with the PIN diodes can advantageously also be deployed at higher frequencies up to several MHz. The capacitance diode D6 also means that larger component tolerances can be permitted. This means reduced component costs. In addition the oscillating circuit can be tuned precisely in the receive instance. This allows high quality levels to be achieved, which means good receive characteristics with low susceptibility to interference, thereby resulting in long receive ranges. The transmitters can frequently be operated with less energy without losing range.

What is claimed is:

1. A transmit/receive circuit, comprising:
a transmit/receive antenna;
a receive oscillating circuit that is connected to the transmit/receive antenna;
an amplifier that is connected to the receive oscillating circuit; and
a PIN diode array comprising at least two PIN diode pairs that are connected anti-parallel between the receive oscillating circuit and the amplifier to protect the amplifier,
wherein each of the at least two PIN diode pairs comprises two PIN diodes connected in parallel,
wherein a capacitance diode is connected parallel to the PIN diode array via a capacitor to decouple a voltage of the capacitance diode toward the receive oscillating circuit, and
wherein the capacitance diode is further connected to a resistor to control the voltage of the capacitance diode in order to trim the receive oscillating circuit.

2. The transmit/receive circuit as claimed in claim 1, wherein a transmitter is connected to the transmit/receive antenna.

3. The transmit/receive circuit as claimed in claim 2, wherein the transmitter is operated with a reduced power compared with a stipulated transmission at a resonant frequency of the receive oscillating circuit to tune the receive oscillating circuit.

4. The transmit/receive circuit as claimed in claim 1, wherein the transmit/receive circuit is used in a remote control of a hearing device.

5. The transmit/receive circuit as claimed in claim 1, wherein the receive oscillating circuit is automatically trimmed by measuring an amplitude of the receive oscillating circuit at resonant frequency.

6. A remote control for a hearing device, comprising:
a transmit/receive antenna;
a receive oscillating circuit that is connected to the transmit/receive antenna;
an amplifier that is connected to the receive oscillating circuit; and
a PIN diode array comprising at least two PIN diode pairs that are connected anti-parallel between the receive oscillating circuit and the amplifier to protect the amplifier,
wherein each of the at least two PIN diode pairs comprises two PIN diodes connected in parallel,
wherein a capacitance diode is connected parallel to the PIN diode array via a capacitor to decouple a voltage of the capacitance diode toward the receive oscillating circuit, and
wherein the capacitance diode is further connected to a resistor to control the voltage of the capacitance diode in order to trim the receive oscillating circuit.

7. The remote control as claimed in claim 6, wherein a transmitter is connected to the transmit/receive antenna.

8. The remote control as claimed in claim 7, wherein the transmitter is operated with a reduced power compared with a stipulated transmission at a resonant frequency of the receive oscillating circuit to tune the receive oscillating circuit.

9. The remote control as claimed in claim 6, wherein the receive oscillating circuit is automatically trimmed by measuring an amplitude of the receive oscillating circuit at resonant frequency.

10. A method for protecting an amplifier connected to a transmit/receive circuit, comprising:
 arranging a transmit/receive antenna to the transmit/receive circuit;
 connecting a receive oscillating circuit to the transmit/receive antenna;
 connecting the amplifier to the receive oscillating circuit; and
 protecting the amplifier by connecting a PIN diode array comprising at least two PIN diode pairs anti-parallel between the receive oscillating circuit and the amplifier,
 wherein each of the at least two PIN diode pairs comprises two PIN diodes connected in parallel,
 wherein a capacitance diode is connected parallel to the PIN diode array via a capacitor to decouple a voltage of the capacitance diode toward the receive oscillating circuit, and
 wherein the capacitance diode is further connected to a resistor to control the voltage of the capacitance diode in order to trim the receive oscillating circuit.

11. The method as claimed in claim 10, wherein a transmitter is connected to the transmit/receive antenna.

12. The method as claimed in claim 11, wherein the transmitter is operated with a reduced power compared with a stipulated transmission at a resonant frequency of the receive oscillating circuit to tune the receive oscillating circuit.

13. The method as claimed in claim 10, wherein the transmit/receive circuit is used in a remote control of a hearing device.

14. The method as claimed in claim 10, wherein the receive oscillating circuit is automatically trimmed by measuring an amplitude of the receive oscillating circuit at resonant frequency.

* * * * *